United States Patent
Eurlings et al.

(10) Patent No.: US 7,316,870 B2
(45) Date of Patent: Jan. 8, 2008

(54) DEVICE MANUFACTURING METHOD, MASK SET FOR USE IN THE METHOD, DATA SET FOR CONTROLLING A PROGRAMMABLE PATTERNING DEVICE, METHOD OF GENERATING A MASK PATTERN AND A COMPUTER PROGRAM

(75) Inventors: Markus Franciscus Antonius Eurlings, Tilburg (NL); Jozef Maria Finders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 614 days.

(21) Appl. No.: 10/814,802

(22) Filed: Apr. 1, 2004

(65) Prior Publication Data

US 2005/0005257 A1    Jan. 6, 2005

(30) Foreign Application Priority Data

Apr. 7, 2003 (EP) .................. 03252181

(51) Int. Cl.
*G03F 1/00* (2006.01)
*G03C 5/00* (2006.01)

(52) U.S. Cl. .......................... 430/5; 430/394
(58) Field of Classification Search .............. 430/5, 430/394; 716/19–21
See application file for complete search history.

(56) References Cited

U.S. PATENT DOCUMENTS

| | | | |
|---|---|---|---|
| 5,045,419 A | 9/1991 | Okumura | |
| 5,532,090 A | 7/1996 | Borodovsky | |
| 5,686,223 A | 11/1997 | Cleeves | |
| 6,528,238 B1 | 3/2003 | Seniuk et al. | |
| 6,534,242 B2 * | 3/2003 | Sugita et al. | 430/312 |
| 6,875,545 B2 * | 4/2005 | Eurlings et al. | 430/5 |
| 6,934,007 B2 * | 8/2005 | Fritze et al. | 355/53 |
| 2002/0100012 A1 | 7/2002 | Sutani et al. | |
| 2002/0195539 A1 | 12/2002 | Nakao et al. | |
| 2003/0054263 A1 | 3/2003 | Kanaya | |

\* cited by examiner

*Primary Examiner*—S. Rosasco
(74) *Attorney, Agent, or Firm*—Pillsbury Winthrop Shaw Pittman LLP

(57) ABSTRACT

Isolated dark features, e.g. contact holes or lines, are exposed in a double exposure, using different illumination settings in the two exposures.

17 Claims, 8 Drawing Sheets

DEVICE MANUFACTURING METHOD, MASK SET FOR USE IN THE METHOD, DATA SET FOR CONTROLLING A PROGRAMMABLE PATTERNING DEVICE, METHOD OF GENERATING A MASK PATTERN AND A COMPUTER PROGRAM

FIELD OF THE INVENTION

The present invention relates to a device manufacturing method using lithographic projection apparatus.

BACKGROUND OF THE INVENTION

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction. A lithographic apparatus comprises a radiation system configured to supply a beam of radiation and to illuminate the patterning device; the apparatus further comprises a projection system configured to image said pattern onto the target portion.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". The radiation system generally includes an illumination system. The illumination system receives radiation from a source, such as a laser, and produces an illumination beam for illuminating an object, such as the patterning device (e.g. a mask on a mask table). Within a typical illumination system, the beam is shaped and controlled such that at a pupil plane of the illumination system the beam has a desired spatial intensity distribution. Such a spatial intensity distribution at the pupil plane effectively acts as a virtual radiation source for producing the illumination beam. Various shapes of said intensity distribution, consisting of (substantially uniform) light areas on a dark background, can be used. Any such shape will be referred to hereinafter as an "illumination mode". Known illumination modes include: conventional (a top-hat shaped intensity distribution in said pupil), annular, dipole, quadrupole and more complex shaped arrangements of the illumination pupil intensity distribution. A lateral position in said pupil plane corresponds to an angle of incidence at the patterning device, and any such angle of incidence is commonly expressed as a fraction sigma ($\sigma$) of a numerical aperture NA of the projection system. Therefore, a more complete characterization of the intensity distribution in a pupil of the illumination system involves, besides an indication of the illumination mode, also an indication of parameters of the illumination mode, such as, for example, $\sigma$ and NA. A combination of an illumination mode and corresponding parameters of said illumination mode is referred to hereinafter as an "illumination setting". Known illumination settings include: a "conventional" illumination setting (whereby the intensity distribution in an illumination pupil is substantially uniform up to a certain radius defined by a parameter value of $\sigma$, where $0<\sigma<1$, and a parameter value of the numerical aperture NA of the projection system), an annular setting (its definition comprising illumination mode parameters $\sigma_{inner}$ and $\sigma_{outer}$), a dipole setting, a quadrupole setting and more complex arrangements. Illumination settings may be formed in various ways. The $\sigma$ value of a conventional illumination mode can be controlled using a zoom lens while $\sigma_{inner}$ and $\sigma_{outer}$ values of an annular mode can be controlled using a zoom-axicon. The NA value can be controlled using a settable iris diaphragm in the projection system.

More complex settings (such as said dipole and quadrupole modes) may be formed using a diaphragm with appropriate apertures in the pupil plane or by a diffractive optical element. Typically, said diffractive optical element is arranged to generate a preselected angular intensity distribution upstream of a pupil plane of the illumination system. This angular intensity distribution is transformed into a corresponding spatial intensity distribution in the pupil plane of the illumination system.

When imaging isolated features such as lines and contact holes, the achievable depth of focus (DOF) is generally small and therefore various techniques for improving DOF when imaging such features have been developed. For isolated lines, various forms of assist features have been proposed but the size of assist features must be limited to avoid the printing of unwanted residues. Hence the extent to which such features can improve DOF is limited. For contact holes, the use of attenuated phase shift masks and three tone masks has been proposed but these methods still do not result in a particularly large DOF.

"Innovative Imaging of Ultra-fine Line without Using Any Strong RET" by Shuji Nakao et al, Optical Microlithography XIV Proceedings of SPIE Vol 4346 (2001) discloses a technique in which a sub-100 nm line pattern is imaged in two exposures. First the dark line is imaged between two bright lines then a second exposure erases the unwanted dark lines between the pairs of bright lines so that the dark lines are isolated in a bright field. Conventional illumination is used so that other large structures can be imaged at the same time.

SUMMARY OF THE INVENTION

One aspect of the present invention provides a method of manufacturing devices in which isolated features, particularly dark features on a bright background, are imaged with good depth of focus, and further provides masks for use in that method.

This and other aspects are achieved according to the invention in a device manufacturing method including, performing a first exposure by using a patterning device to endow a beam of radiation with a first pattern in its cross-section, said first pattern including a desired dark isolated feature in a bright local region and being dark around said bright local region; and projecting the patterned beam of radiation onto a target portion of the layer of radiation-sensitive material, and performing a second exposure by using a patterning device to endow the beam of radiation with a second pattern in its cross-section, said second pattern being dark in a region corresponding to said bright local region and bright in a wider region around said local region; and projecting the patterned beam of radiation onto a target portion of a layer of radiation-sensitive material. First illumination settings are used in the first exposure and second illumination settings are used in the second exposure, the second illumination settings being at least partly different than the first illumination settings.

By optimizing the illumination settings for the two exposures separately, it is possible to maximize the DOF and exposure latitude for the dark isolated feature. In some cases, the illumination mode for the second exposure is preferably arranged so that substantially no light enters the dark region corresponding to the local bright region in the first exposure. In other cases, the out-of-focus behaviors of the first and second exposures can be arranged to cancel each other out so as to provide a combined depth of focus greater than the depths of focus of either exposure separately. Experiments or simulations can be used to determine which approach is most appropriate for a given pattern to be exposed.

Isolated features are, for example, features separated from their nearest neighbor by a distance greater than 3 times the relevant target feature dimension, e.g. line width or contact hole diameter. Here, the target feature dimension is the dimension of the feature in resist after development that is aimed at. Fabrication of a circuit pattern involves the control of space tolerances between features, and of feature dimensions. In particular the control of the smallest such space and/or dimension permitted in the fabrication of the device is of importance. The smallest space and/or smallest width is referred to as the critical dimension; the target feature dimension generally is a critical dimension in the present context, and therefore may also be referred to, hereinafter, as the critical dimension, or CD, or target CD.

The illumination settings to be optimized for the two exposures may include the illumination mode—e.g. circular, annular, dipole, and quadrupole—and parameters of the illumination mode—e.g. NA, $\sigma$, $\sigma_{inner}$, $\sigma_{outer}$, orientation of multipole modes, polarization, dose, focus, lens settings and exposure wavelength bandwidth, etc.. It is also possible to create specific custom illumination distributions for the two exposures, e.g. using diffractive optical elements.

The present invention is particularly applicable to the formation of contact holes using a negative tone resist, in which case an improved depth of focus can be obtained if the first and second exposures employ a quadrupole illumination mode with poles on the diagonals but with the poles nearer the center of the pupil plane in the second exposure.

The present invention is also applicable to the formation of isolated lines in which case an improved depth of focus can be obtained if the first exposure uses a dipole illumination mode with the poles on the axis perpendicular to the isolated line and the second exposure uses a dipole illumination mode with the poles on the axis parallel to the isolated line. Especially good results are achieved where the half-width of the local region is in the range of from 1.5 to 5 times the target width of the isolated line.

A circuit pattern of features corresponding to an individual layer of an IC generally comprises a plurality of features with different spacings between the features. Hence, features may occur at different neighboring distances or ranges of neighboring distances, and can be classified accordingly. Generally, "dense features" are commonly known to be separated apart by a distance ranging between one and two times the target feature dimension; similarly, "isolated features" are commonly known not to be separated apart by a distance less than two times the target feature dimension. However, there is no commonly accepted exact definition of "dense features"; neither is there a commonly accepted exact definition of "isolated features". The present invention is applicable to the formation of a circuit pattern of contact holes comprising both isolated features and dense features by having the first pattern including a desired dark, isolated feature in a bright local region and being dark around the bright local region and further comprising an extended bright local region comprising dark, dense features, the first pattern being dark around the extended local region, the second pattern being dark in a region substantially corresponding to the bright local region and the extended bright local region, and bright in a wider region around the local region and the extended local region. Due to the presence of the local bright region in which the isolated feature is embedded, the illumination setting suitable for use with the imaging of the isolated feature matches with an illumination setting suitable for imaging the dense features, and can therefore advantageously be used in the first exposure for illuminating both types of features simultaneously.

A further distinction between types of features can be made by identifying three types of features in a circuit pattern of features: dense features, semi-dense features and isolated features, in accordance with three consecutive ranges of mutual distances between features. The present invention is also applicable to the formation of a circuit pattern of contact holes comprising the three types of features by having the first pattern including a desired dark, isolated feature in a bright local region and being dark around the bright local region and further comprising an extended bright local region comprising dark, dense features, the first pattern being dark around the extended local region, and by having the second pattern being dark in a region substantially corresponding to the bright local region and the extended bright local region, and bright in a wider region around the local region and the extended local region, whereby the wider region further comprises dark, medium-dense features.

In the second exposure, the illumination setting suitable for use with the imaging of the dark region substantially corresponding to the bright local region and the extended bright local region (of the first pattern) matches with an illumination setting suitable for imaging the semi-dense features. This is due to the absence, in the second pattern, of high spatial frequencies typical for dense features (as present in the first pattern). Therefore, a single, optimum illumination setting can advantageously be used in the second exposure for illuminating the dark region and the dark, semi-dense features simultaneously.

Embodiments of the invention are particularly applicable to the formation of patterns comprising either dense and isolated contact holes or dense, semi-dense and isolated contact holes.

Embodiments of the present invention also provide a mask set for use in the above method and embodying a first pattern including a desired dark isolated feature in a bright local region; and a second pattern that is dark in a region corresponding to the bright local region and light in a wider region around the local region.

The first and second patterns may be embodied in different regions of a single mask if the patterns to be exposed are less than half the size of the mask or may be embodied in separate masks.

Yet further, embodiments of the present invention provide a data set for use in the above method and for controlling a programmable patterning device to effect a first pattern including a desired dark isolated feature in a bright local region; and a second pattern that is dark in a region corresponding to the bright local region and light in a wider region around the local region.

Still further, embodiments of the present invention provide a method of generating a mask pattern including, identifying a isolated, dense and semi-dense contact holes in a target pattern of contact holes, defining a first pattern data set representing a first pattern comprising the dark isolated contact hole in a bright local region and being dark around the bright local region, and further comprising the dense contact holes in an extended bright local region and being dark around the extended local region, defining a second pattern data set representing a second pattern being dark in a region substantially corresponding to the bright local region and the extended bright local region, and being bright in a wider region around the local region and the extended local region, and further comprising the semi-dense contact holes, defining first and second illumination settings and projection system settings for imaging the first and second pattern respectively, modifying the first and/or second pattern data sets by applying optical proximity correction in the first and/or second pattern to at least one contact hole based on the first and second illumination settings and projection system settings, and- generating first and second mask patterns using respectively the first and second modified data sets.

A computer program for performing the above method is also provided by the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE PREFERRED EMBODIMENTS

Lithographic Apparatus

Figure 1:
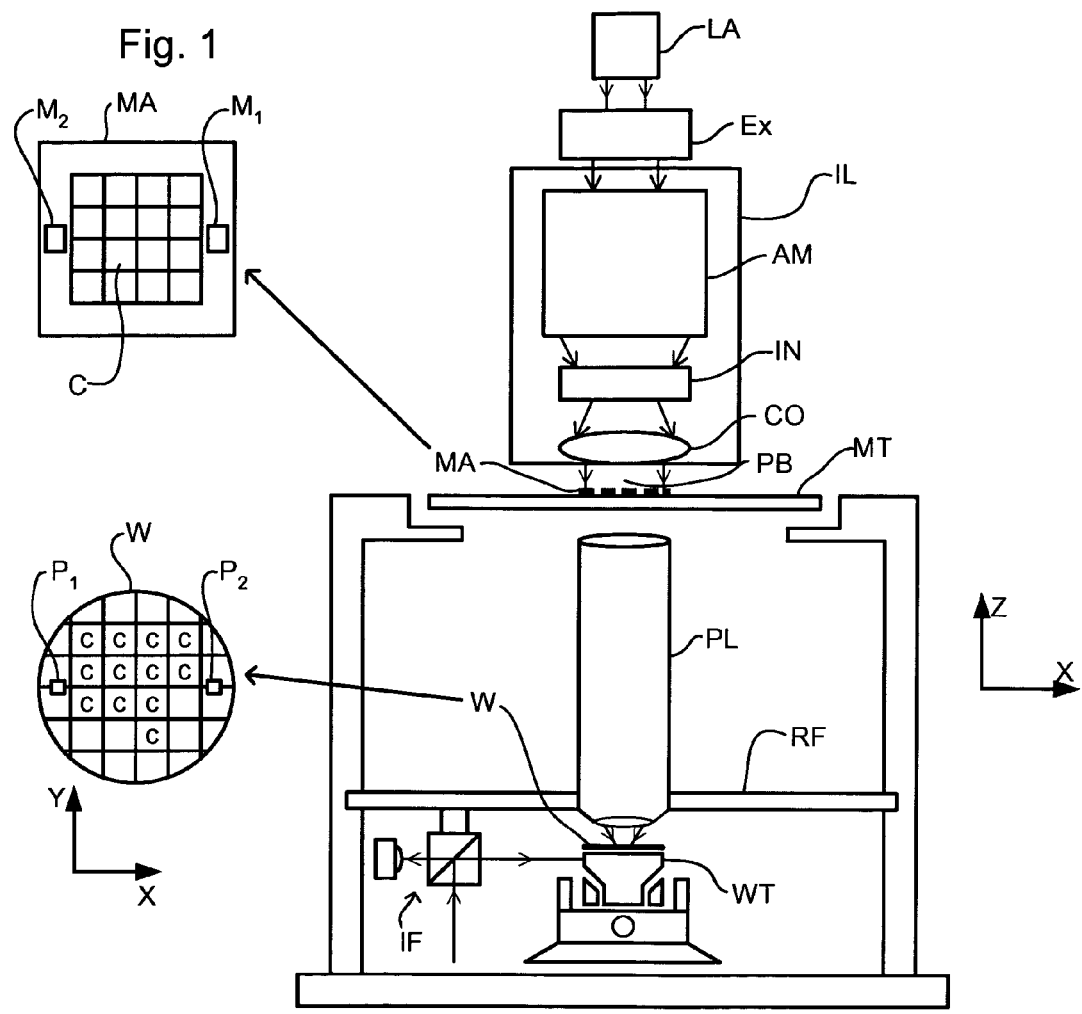
FIG. 1 depicts a lithographic projection apparatus according to an embodiment of the invention.

FIG. 1 schematically depicts a lithographic projection apparatus which may be used in the methods of the invention. The apparatus includes, a radiation system Ex, IL, for supplying a projection beam PB of radiation (e.g. DUV radiation), which in this particular case also comprises a radiation source LA, a first object table (mask table) MT provided with a mask holder for holding a mask MA (e.g. a reticle), and connected to a first positioning device for accurately positioning the mask with respect to item PL, a second object table (substrate table) WT provided with a substrate holder for holding a substrate W (e.g. a resist-coated silicon wafer), and connected to second positioning devices for accurately positioning the substrate with respect to item PL, and a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of a patterning device, such as a programmable mirror array of a type as referred to above.

The source LA (e.g. an excimer laser) produces a beam of radiation. This beam is fed into an illumination system (illuminator) IL, either directly or after having traversed conditioning devices, such as a beam expander Ex, for example. The illuminator IL may comprise adjusting devices AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning devices (and interferometric measuring devices IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Embodiment 1

In a first method of the invention, an isolated contact hole is printed using a negative resist. This is done in two exposures.

Figure 2A:
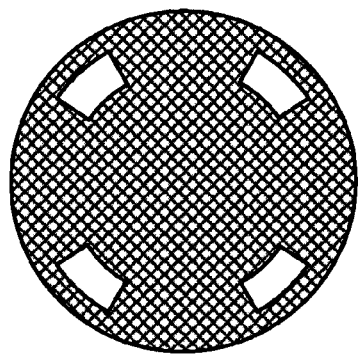
FIGS. 2A-G illustrate the illumination modes and mask patterns used in a first method according to the invention together with graphs of Focus vs. position for the separate and combined exposures.
Figure 2B:
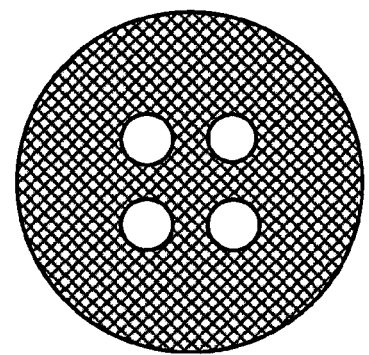
Figure 2C:
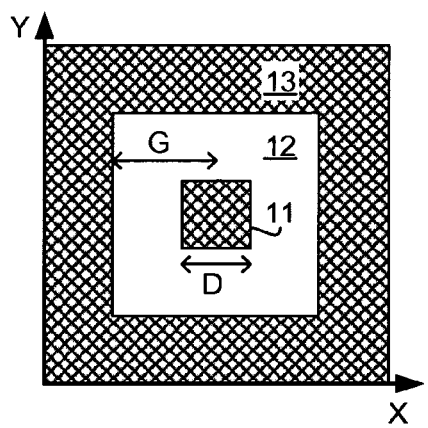

In a first exposure, a quadrupole illumination mode, shown schematically in FIG. 2A, is used to illuminate a mask, the relevant part of which is shown in FIG. 2C, which has an opaque region 11 corresponding to the contact hole surrounded by a local bright region 12. The bright region 12 is in turn surrounded by an opaque region 13 which extends to the locality of the neighboring features. The opaque region 11, corresponding to the contact hole, has a diameter D equal to the target diameter of the desired contact hole, e.g. 100 nm, plus a bias value, e.g. in the range of from 0 to 60 nm. The width G of the local bright region (G represents half the total width or diameter of the local bright region) is set to be about two or three times the target diameter of the desired contact hole plus the bias value, e.g. 230 to 260 nm.

Notice that dimensions given here and below are in "at substrate level" units so that the actual dimensions in the mask will be larger by a factor equal to the inverse of the magnification of the projection system PL, e.g. 4 to 5 times larger.

Figure 2D:
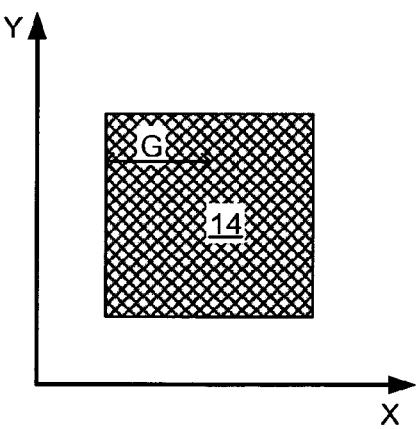

In the second exposure, a quadrupole illumination mode, shown schematically in FIG. 2B, is also used, but with the poles closer to the origin of the pupil plane. This illuminates a pattern, part of which is shown in FIG. 2D, which has an opaque region 14 corresponding to the bright region 12 in the first pattern and is bright elsewhere, save for dark regions (not shown) covering other structures exposed in the first exposure. It should be noted that the opaque region of the second exposure need not be exactly the same size as the local bright region in the first exposure. If region 12 is larger than region 14 there will be some double exposure but that will have no detrimental effect. If region 12 is smaller than region 14 a thin square outline will be left unexposed. This does not matter if the resulting resist structure will be washed away during development of the resist. In the case that the region 14 is larger than region 12, the difference should be less than half the target CD for the exposure. Where region 12 is larger than region 14, the isolated feature is less protected from the second exposure but that can be tolerated to a certain degree.

The first exposure is carried out with 193 nm exposure radiation at a NA optimum for imaging dense contact holes, e.g. NA=0.71 for 100 nm holes at a pitch of approximately 250 nm, which accordingly may be imaged in the same step. Optimum values of D and G can be found by looking for the optimum exposure dose window.

The second exposure, also using 193 nm exposure radiation, is carried out at illumination settings determined to have minimum disturbance at the center of the contact hole for all focus levels while simultaneously exposing the outer region. In the present example this criterion results in the use of a low NA setting, e.g. 0.5, and quadrupole settings optimized for the pitch of the second exposure structure. Hence the positions of the poles move towards the center of the pupil plane as compared to the settings for the first exposure.

The second exposure floods the outer regions, exposing the outer parts left unexposed by the first exposure. It also adds some energy in the out-of-focus region of the inner region, improving the through-focus behavior. This is because the first and second exposures have opposite out-of-focus behaviors.

Figure 2E:
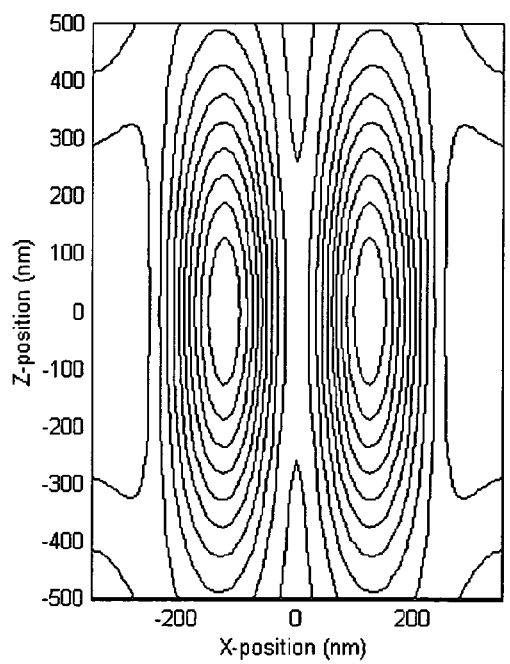
Figure 2F:
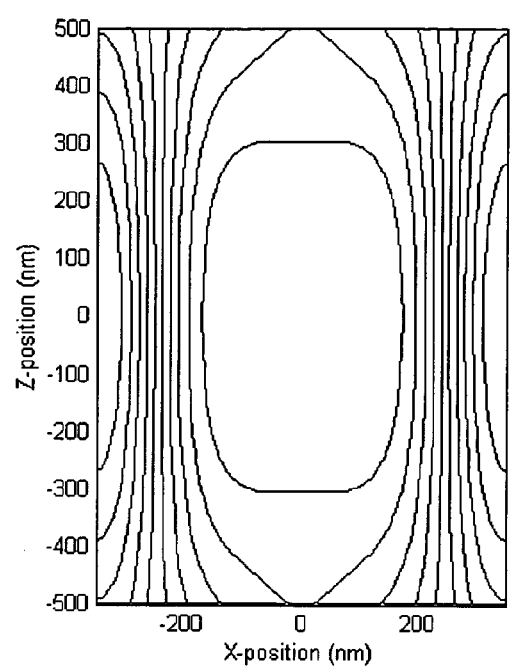
Figure 2G:
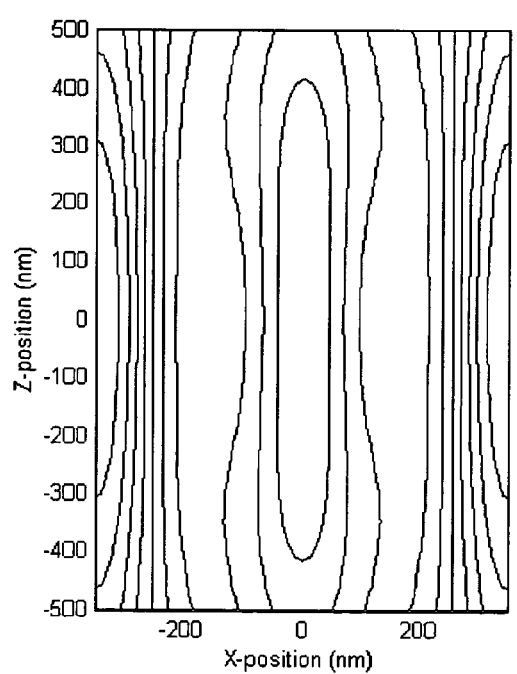

The effects of the first and second exposure are shown in FIGS. 2E and F respectively, which show the intensity of the aerial image in normalized units as a function of X position and Z (focus). FIG. 2G is the sum of FIGS. 2E and F. It can be seen that the X distribution of the dose delivered is uniform for a wide range of Z values, indicating a large depth of focus.

Embodiment 2

Figure 3A:
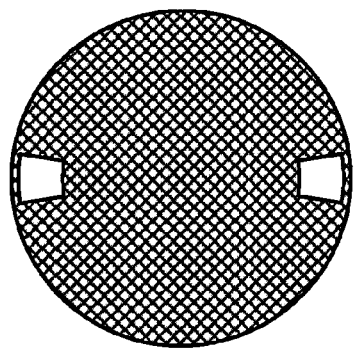
FIGS. 3A-G are views similar to FIGS. 2A-G relating to a second method according to the invention.
Figure 3B:
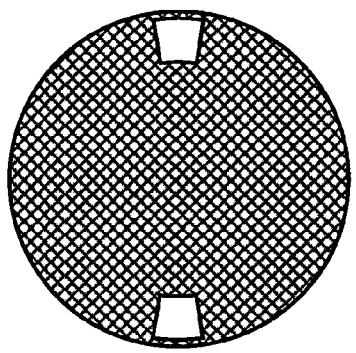
Figure 3C:
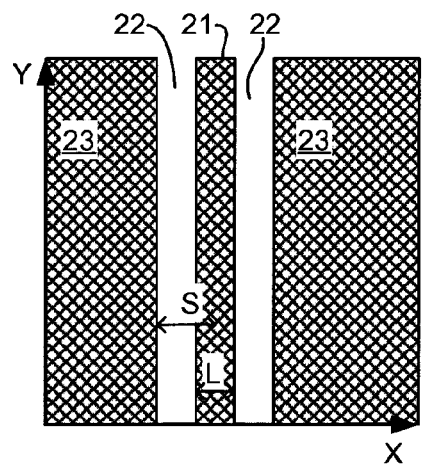

In a second method according to the invention, isolated lines are printed using two exposures. In a first exposure, a dipole illumination mode, shown schematically in FIG. 3A, is used to illuminate a mask, the relevant part of which is shown in FIG. 3C, which has an opaque region 21 corresponding to the isolated line surrounded by a local bright region 22. The poles of the dipole are arranged on the axis perpendicular to the line 21. The bright region 22 is in turn surrounded by an opaque region 23, which preferably extends to the locality of the neighboring features. Opaque region 23 should be as large as possible but improved results can be achieved with a smaller opaque region 23, e.g. extending for a distance of 2 or 3 times S. The opaque region 21, corresponding to the isolated line has a width L equal to the target width of the desired line, e.g. 75 nm, in some cases plus a bias value. The halfwidth S of the local bright region is set to be in the range of from 1.5 to 2.5 times the full width of the line, e.g. about 230 nm.

Figure 3D:
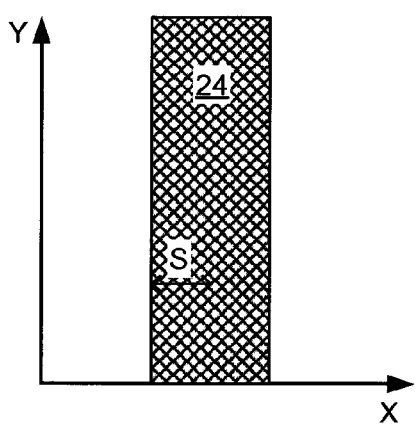

In the second exposure, a dipole illumination mode, shown schematically in FIG. 3B, is again used, but with the poles on the axis parallel to the line 21. This illuminates a pattern, part of which is shown in FIG. 3D, which has an opaque region 24 corresponding to the bright region 22 in the first pattern and is bright elsewhere, save for dark regions (not shown) covering other structures exposed in the first exposure.

It will be appreciated that it is very convenient to combine this double dipole exposure for isolated lines with double dipole exposures performed to image both horizontal and vertical dense lines with low k1. In that case the process conditions optimum for the dense lines can be used in the two exposures. The immediate vicinity of the isolated lines is exposed in the exposure with the most suitable conditions and the remainder of the open area is exposed in the other exposure.

Figure 3E:
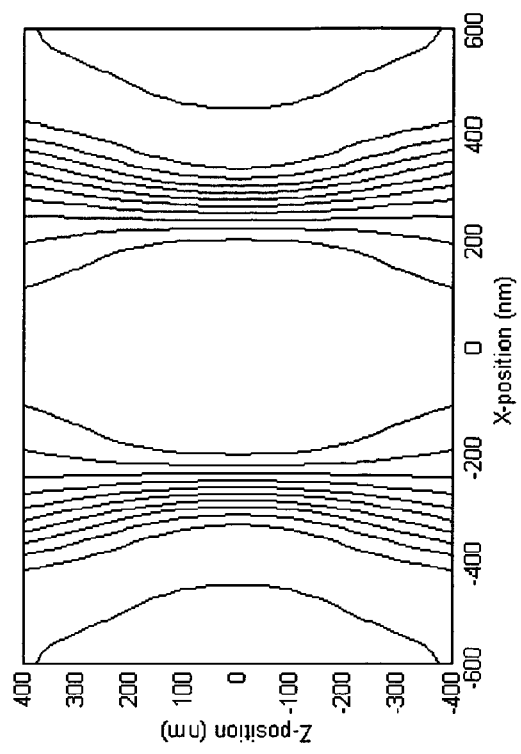
Figure 3F:
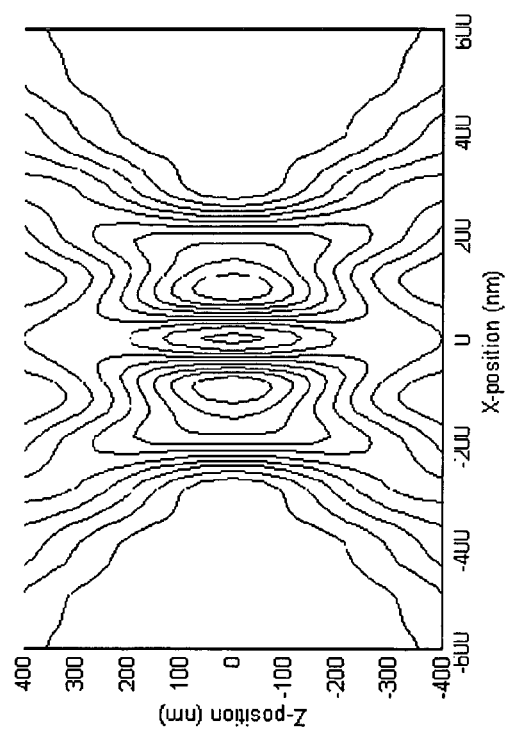
Figure 3G:
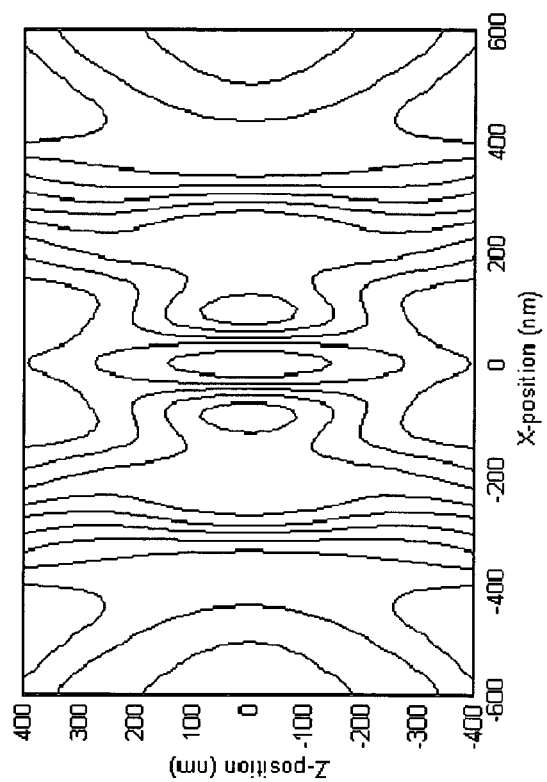

The effects of the first and second exposure are shown in FIGS. 3E and F respectively, which show the intensity of the aerial image in normalized units as a function of X position and Z (focus). FIG. 3G is the sum of FIGS. 3E and F. It can be seen that the X distribution of the dose delivered is uniform for a wide range of Z values, indicating a large depth of focus.

Embodiment 3

Figure 4A:
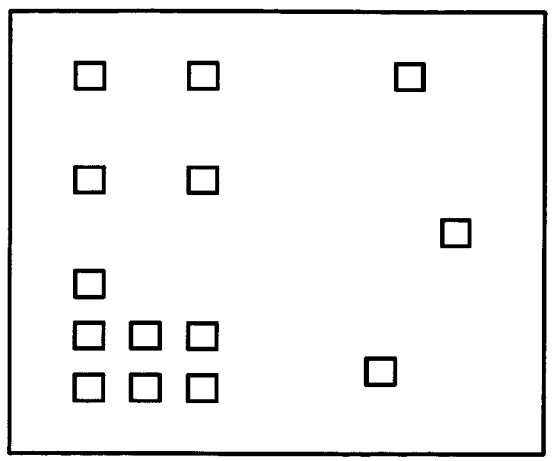
FIGS. 4A-C illustrate a target pattern of contact holes, and two constituent patterns comprising isolated and dense contact holes (FIG. 4B) and semi-dense contact holes (FIG. 4C).
Figure 4B:
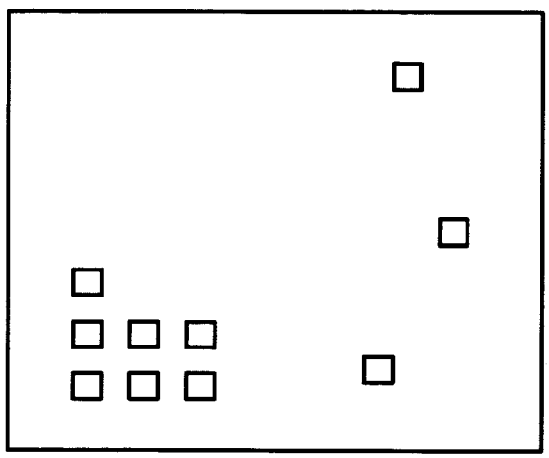
Figure 4C:
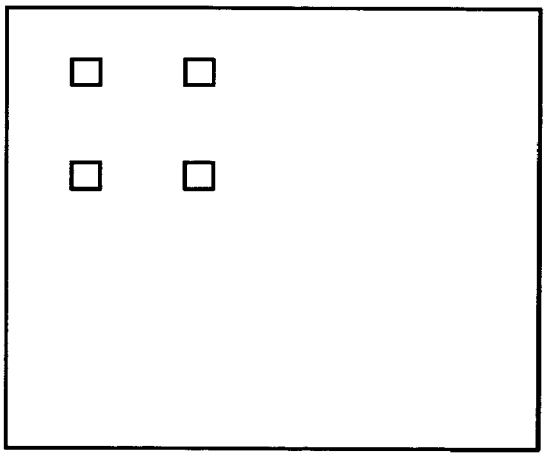

A circuit pattern of contact holes corresponding to an individual layer of an IC generally comprises a plurality of contact holes with different spacings between the contact holes. The contact holes in such a pattern can be classified accordingly. For example, three types of contact holes referred to hereinafter as dense contact holes, semi-dense contact holes and isolated contact holes may be defined as contact holes with mutual neighboring distances up to twice the target feature dimension, with neighboring distances between twice and four times the target feature dimension, and with neighboring distances larger than four times the target feature dimension respectively. Alternative schemes for distinguishing the three ranges are possible and the present invention is not limited to the example given here (dense features are commonly known to comprise features separated apart by at least one target feature dimension, and isolated features are commonly known not to comprise features separated apart by less than two times the target feature dimension). A third method according to the invention is the same as the method of the first embodiment, save for the second exposure (and the explicit illustration of the imaging of isolated and dense contact holes simultaneously in the first exposure). A first and a second sub-pattern—which in combination constitute a target pattern of dense, semi-dense and isolated contact holes—are illustrated in FIG. 4. FIG. 4A shows the target pattern, FIG. 4B shows the first sub-pattern comprising isolated and dense contact holes, and FIG. 4C shows the second sub-pattern comprising semi-dense contact holes. It will be appreciated that although square targets are drawn, the features actually printed in the substrate will be round, due to the low pass filtering effects of the projection lens.

Figure 5:
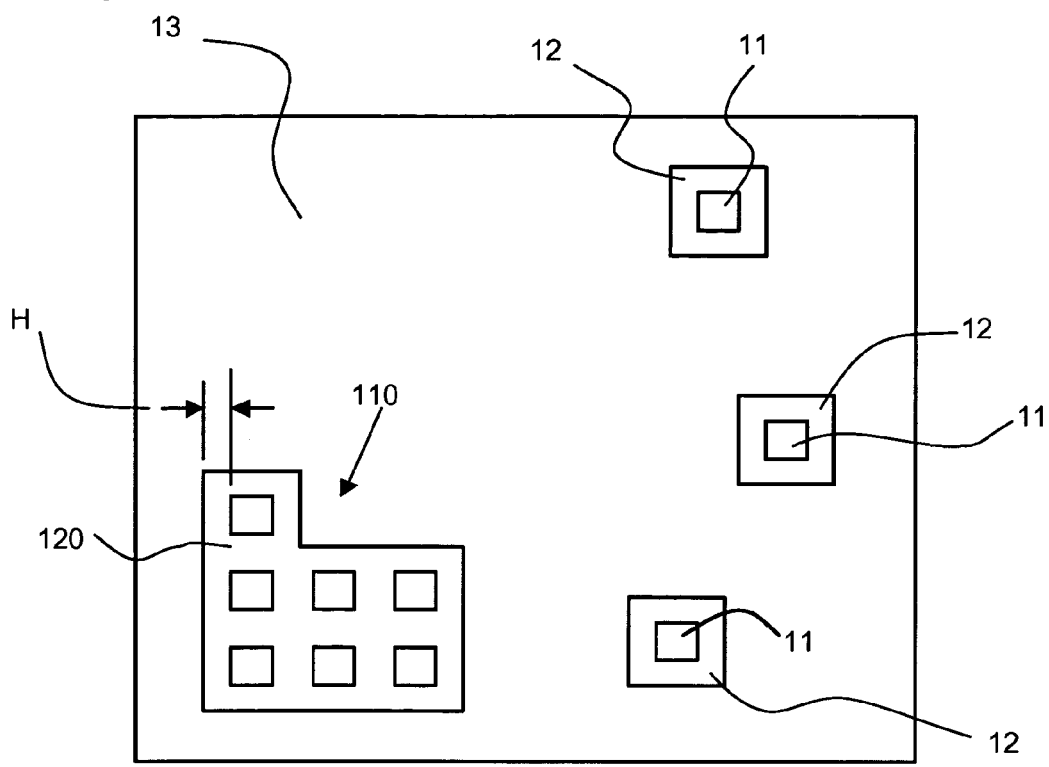
FIG. 5 illustrates a mask configured to pattern dense and isolated contact holes.

In a first exposure, a quadrupole illumination mode, shown schematically in FIG. 2A, is used to illuminate a mask, the relevant part of which is shown in FIG. 5, which has opaque regions 11 corresponding to isolated contact holes surrounded by a local bright regions 12. The bright regions 12 are in turn surrounded by an opaque region 13, which extends to the locality of groups 110 of dense contact holes. These dense contact holes are located in extended bright local regions 120. The gap H between an edge of the extended region and a neighboring contact hole is set to be in the range from the target width of a contact hole and the maximum spacing of contact holes defined as dense.

The first exposure is carried out at a NA which is optimum for imaging the groups of dense contact holes 110, e.g. NA=0.75 for 100 nm holes at a pitch of approximately 250 nm. Optimum illumination settings for the first exposure are quadrupole at $\sigma_{inner}$=0.62 and $\sigma_{outer}$=0.92. Optimum values of D and G can be found by looking for the optimum exposure dose window. Both the first and second exposures involve radiation of a wavelength of 193 nm.

Figure 6:
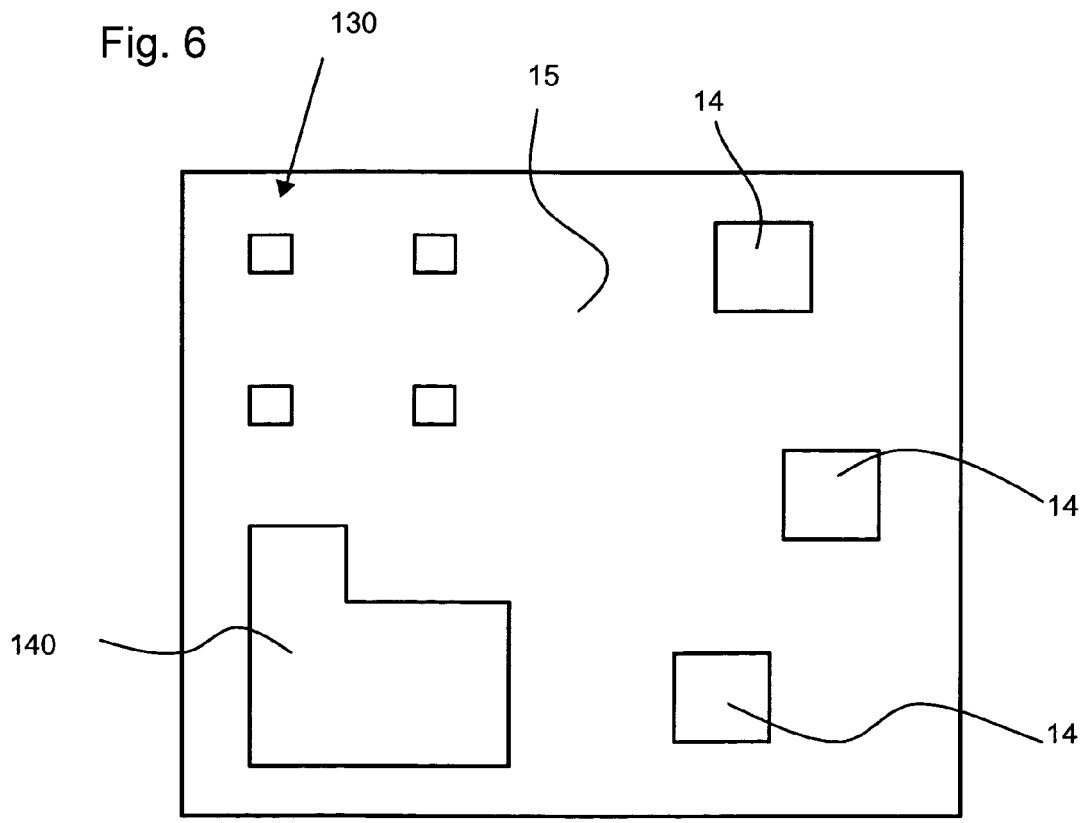
FIG. 6 illustrates a mask configured to pattern semi-dense contact holes.

A mask for the second exposure is shown in FIG. 6. The second exposure is used to image opaque areas 14 corresponding to bright regions 12 associated with the isolated contact holes and similar opaque areas 140 corresponding to the bright extended regions 120 for covering fields with groups of dense contact holes. The opaque areas 14 and 140 are surrounded by a transmissive ("bright") wider region 15, whereby this wider region 15 comprises groups 130 of semi-dense contact holes. Optimum NA and illumination settings for the second exposure are NA=0.52, and quadrupole at $\sigma_{inner}$=0.65 and $\sigma_{outer}$=0.89.

Figure 7A:
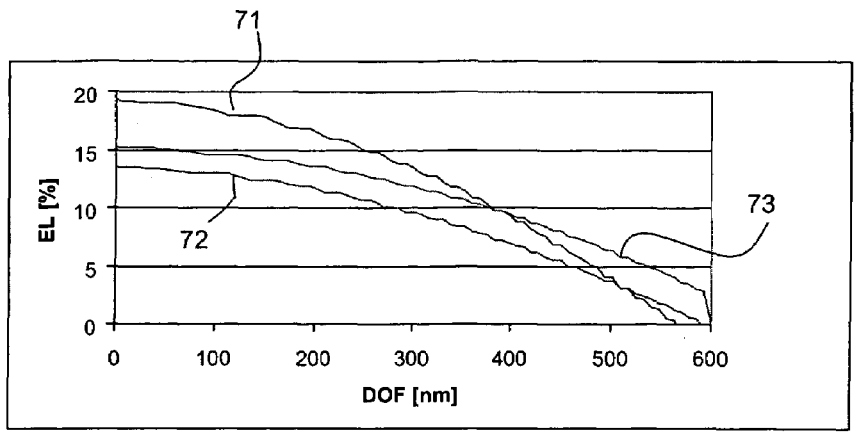
FIG. 7A shows process latitudes for dense, semi-dense and isolated contact holes obtained with double exposure.
Figure 7B:
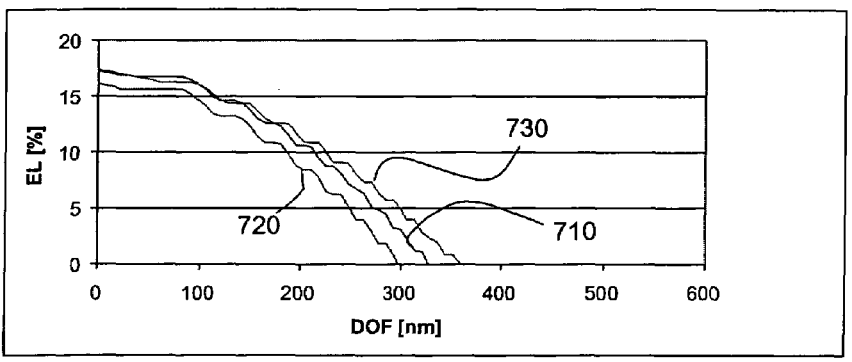
FIG. 7B shows process latitudes for dense, semi-dense and isolated contact holes obtained with single exposure.
Figure 8:
FIG. 8 illustrates an illumination setting for use with single exposure.

In FIG. 7 process latitudes 71, 72, and 73 obtainable for dense, semi-dense and isolated contact holes, respectively, as obtained with the present embodiment of the method, are compared with process latitudes obtainable 710, 720, and 730 obtainable for dense, semi-dense and isolated contact holes, respectively, with an optimally chosen single exposure process for imaging the target pattern shown in FIG. 4. FIG. 7 shows an increase of depth of focus at comparable exposure latitude, illustrating an advantage of the present method. The results for the present double exposure method are based on the use of negative tone resist. The results for the single exposure process are based on the use of a reverse tone mask (mostly opaque except for the contact holes) a positive resist, and a combined quadrupole and conventional illumination setting, as illustrated in FIG. 8.

In the present embodiment the dense contact holes 110 are spaced apart, on a square grid, at a pitch of two times a target width of the contact holes. Thus the minimum distance in a bright area between two contact holes is one times the CD. The distance between two contact holes along a diagonal in the grid is 1.41 times the CD. However, illumination settings providing sufficient process latitude for simultaneous imaging of other patterns of dense contact holes together with isolated contact holes (combined in a first pattern according to the present invention) are possible as well. Such other patterns may comprise a group of dense contact holes spaced apart at pitches up to, for example, three or even four times the target width of the contact holes. Similarly, the medium dense contact holes which may be comprised in the second pattern are, in the present embodiment, spaced apart on a square grid at a pitch of three times the contact hole width, but other patterns of medium dense contact holes spaced apart at pitches between, for example, three and six times a CD, are possible as well.

Figure 9:
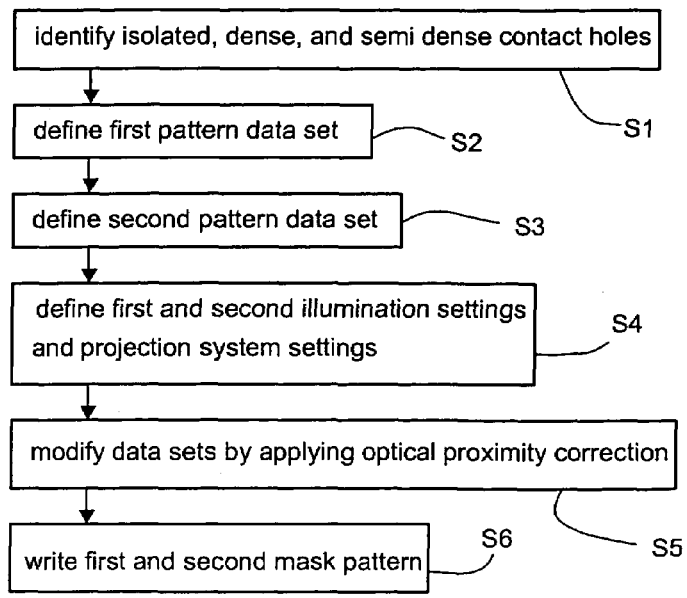
FIG. 9 shows a flow diagram of activities for writing a mask pattern.

To obtain the first and second patterns, a process to write a mask pattern configured for use in the present embodiment can be used. The process is schematically indicated in FIG. 9, and includes, identifying a isolated, dense and semi-dense contact holes in a target pattern of contact holes (activity S1 in FIG. 9), defining a first pattern data set representing a first pattern comprising the dark isolated contact hole in a bright local region and being dark around the bright local region, and further comprising the dense contact holes in an extended bright local region and being dark around the extended local region (activity S2 in FIG. 9), defining a second pattern data set representing a second pattern being dark in a region substantially corresponding to the bright local region and the extended bright local region, and being bright in a wider region around the local region and the extended local region, and further comprising the semi-dense contact holes (activity S3 in FIG. 9), defining first and second illumination settings and projection system settings for imaging the first and second pattern respectively (activity S4 in FIG. 9), modifying the first and/or second pattern data sets by applying optical proximity correction in the first and/or second pattern to at least one contact hole based on the first and second illumination settings and projection system settings (activity S5 in FIG. 9), writing a first and second mask pattern using respectively the first and second modified data set (activity S6 in FIG. 9).

Modified data sets obtained upon completion of activity S5 can be used as input to a computer configured to control, for example, an e-beam mask-writing apparatus. The identification of dense, semi-dense and isolated contact holes in a target pattern can be based on the pitch ranges at which the contact holes are present in the target pattern (the target pattern is the combined first and second pattern). In the context of the present text and claims, sizes of features are referred to as those sizes that the features nominally have at substrate level (the target size). Generally, additional size deviations at the mask are introduced to compensate for errors occurring, for example, during projection and exposure of a pattern; such a re-sizing of features of the object pattern is referred to in the present text and claims as biasing and/or Optical Proximity Correction ("OPC"). An amount of biasing and/or OPC is also commonly expressed in terms of a corresponding, nominal amount of re-sizing at substrate level. Optical Proximity Correction may also be effected by providing sub resolution assist features in the neighborhood of the features. Similar processes to obtain first and second pattern data sets based on identification of, for example, isolated and dense contact holes only, or on semi-dense and isolated contact holes only, can be defined in analogy with the above mentioned process.

While specific embodiments of the invention have been described above, it will be appreciated that the invention may be practiced otherwise than as described. For example, while the formation of contact holes using a negative tone resist has been described, the invention may also be applied to the formation of islands, pillars or dots using a positive tone resist. The description is not intended to limit the invention.

What is claimed is:

1. A device manufacturing method comprising
    performing a first exposure by patterning a beam of radiation with a first pattern in its cross-section, said first pattern including a desired dark isolated feature in a bright local region and being dark proximate the bright local region; and projecting the patterned beam of radiation onto a target portion of a layer of radiation-sensitive material on a substrate; and
    performing a second exposure by patterning the beam of radiation with a second pattern in its cross-section, said second pattern being dark in a region substantially corresponding to said bright local region and bright in a wider region around said local region; and projecting the patterned beam of radiation onto the target portion of the layer of radiation-sensitive material;

wherein said first and second exposures are carried out in either order; and wherein first illumination settings are used in said first exposure and second illumination settings are used in said second exposure, said second illumination settings being different than said first illumination settings.

2. A method according to claim 1 wherein said second illumination settings are arranged so that in the second exposure substantially no radiation enters the dark region corresponding to the local bright region in the first exposure.

3. A method according to claim 1 wherein said first and second illumination settings differ in illumination mode and/or at least one parameter of the illumination mode.

4. A method according to claim 3 wherein said illumination mode is one of a conventional, an annular, a dipole and a quadrupole mode.

5. A method according to claim 3 wherein said at least one parameter of the illumination mode is one of NA, $\sigma$, $\sigma_{inner}$, $\sigma_{outer}$, orientation of multipole modes, polarization, dose, focus, lens settings and exposure wavelength bandwidth.

6. A method according to claim 1 wherein said dark isolated feature is a contact hole and said radiation sensitive material is negative tone resist.

7. A method according to claim 6 wherein said first and second illumination settings are quadrupole illumination modes with poles on the diagonals but with the poles nearer the optical axis in the second illumination settings.

8. A method according to claim 6 wherein the first and second illumination settings include NA of a projection system and the value of NA is smaller in the second illumination settings than in the first.

9. A method according to claim 1 wherein said dark isolated feature is an isolated line.

10. A method according to claim 9 wherein said first illumination settings include a dipole illumination mode with the poles on the axis perpendicular to the isolated line and said second illumination settings include a dipole illumination mode with the poles on the axis parallel to the isolated line.

11. A method according to claim 9 wherein the half-width of the local region is in the range of from 1.5 to 5 times a target width of the isolated line.

12. A method according to claim 1 whereby said first pattern further comprises an extended bright local region comprising dark, dense features, said first pattern further being dark around said extended local region, said second pattern being dark in a region substantially corresponding to said bright local region and said extended bright local region, and being bright in a wider region around said local region and said extended local region.

13. A method according to claim 12 whereby said dense features are dense contact holes.

14. A method according to claim 13 whereby said dense contact holes are spaced apart at a pitch between two and four times a target width of the contact holes.

15. A method according to claim 1 whereby said wider region of the second pattern further comprises dark, medium-dense features.

16. A method according to claim 15 whereby said medium dense features are contact holes.

17. A method according to claim 13 whereby said dense contact holes are spaced apart at a pitch between two and three times a target width of the contact holes and said wider region of the second pattern further comprises dark, medium-dense contact holes spaced apart at a pitch between three and six times a target width of the contact holes.

* * * * *